United States Patent
Kwon et al.

(10) Patent No.: US 7,371,614 B2
(45) Date of Patent: May 13, 2008

(54) IMAGE SENSOR DEVICE AND METHODS THEREOF

(75) Inventors: Yong-Chai Kwon, Suwon-si (KR);
Suk-Chae Kang, Yongin-si (KR);
Kang-Wook Lee, Suwon-si (KR);
Gu-Sung Kim, Seongnam-si (KR);
Jong-Woo Kim, Seongnam-si (KR);
Seong-Il Han, Suwon-si (KR);
Sun-Wook Heo, Seoul (KR);
Jung-Hang Yi, Incheon Metropolitan (KR); Keum-Hee Ma, Andong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 284 days.

(21) Appl. No.: 11/342,799

(22) Filed: Jan. 31, 2006

(65) Prior Publication Data

US 2007/0019089 A1 Jan. 25, 2007

(30) Foreign Application Priority Data

Jul. 25, 2005 (KR) ............... 10-2005-0067248

(51) Int. Cl.
*H01L 21/50* (2006.01)
*H01L 21/48* (2006.01)
*H01L 21/44* (2006.01)

(52) U.S. Cl. ................ 438/115; 438/118

(58) Field of Classification Search ............ 438/115, 438/118; 257/433, 434
See application file for complete search history.

(56) References Cited

U.S. PATENT DOCUMENTS

| 5,321,297 | A  | * | 6/1994  | Enomoto ............ 257/432 |
| 5,514,888 | A  | * | 5/1996  | Sano et al. ............ 257/232 |
| 5,976,907 | A  | * | 11/1999 | Shigeta et al. ............ 438/65 |
| 6,582,988 | B1 | * | 6/2003  | Hsiao et al. ............ 438/70 |
| 6,780,734 | B2 |   | 8/2004  | Kim et al. |
| 7,006,191 | B2 | * | 2/2006  | Chen et al. ............ 349/158 |
| 2005/0029643 | A1 | | 2/2005 | Koyanagi |

FOREIGN PATENT DOCUMENTS

| KR | 10-2002-0014519 | 2/2002 |
| KR | 10-2004-0061098 | 7/2004 |

* cited by examiner

*Primary Examiner*—Luan Thai
(74) *Attorney, Agent, or Firm*—Harness, Dickey & Pierce, PLLC

(57) ABSTRACT

An image sensor device and methods thereof. In an example method, a protective layer may be formed over at least one microlens. An adhesive layer may be formed over the protective layer. The adhesive layer may be removed so as to expose the protective layer. The protective layer may be removed so as to expose the at least one microlens, the exposed at least one microlens not including residue from the adhesive layer. The at least one microlens may have an improved functionality due at least in part to the lack of residue from the adhesive layer. In an example, the at least one microlens may be included in an image sensor module.

20 Claims, 18 Drawing Sheets

IMAGE SENSOR DEVICE AND METHODS THEREOF

PRIORITY STATEMENT

This U.S. non-provisional application claims benefit of priority under 35 U.S.C. §119 of Korean Patent Application No. 2005-67248, filed on Jul. 25, 2005, the entire contents of which are incorporated herein by reference.

BACKGROUND OF THE INVENTION

1. Field of the Invention

Example embodiments of the present invention relates generally to an image sensor device and methods thereof, and more particularly to an image sensor device including at least one microlens and methods thereof.

2. Description of the Related Art

Image sensor modules may include solid state image sensing devices or complementary metal oxide semiconductor (CMOS) image sensors (CISs). Image sensor modules may detect an image of an object and output corresponding electrical signals using photoelectric conversion devices and/or charge coupled devices (CCDs). Image sensor modules may be utilized in a wide range of applications including, for example, digital cameras, digital camcorders, telecommunication terminals, camera phones, multi-media personal computers and surveillance cameras.

FIG. 1 is a cross-sectional view of a conventional image sensor module 70. Referring to FIG. 1, the conventional image sensor module 70 may include a flexible circuit substrate 71 and an image sensor device 40 mounted on an upper surface of the flexible circuit substrate 71. The image sensor device 40 may include an image sensor chip 22 having chip pads 25 and microlenses 27. A protective plate 32 may be attached to the image sensor chip 22 with a photosensitive adhesive pattern 36. The protective plate 32 may include through holes 37, through which the chip pads 25 of the image sensor chip 22 may be exposed. Bonding wires 76 may electrically connect the flexible circuit substrate 71 to the chip pads 25 of the image sensor chip 22. A lens unit 77 may be formed on the upper surface of the flexible circuit substrate 71 at least partially surrounding (e.g., fully surrounding) the image sensor device 40 and may include a lens 78 for focusing an image on the image sensor device 40 and/or protecting the image sensor device 40.

The protective plate 32 may protect the microlenses 27 of the image sensor chip 22 at a wafer level, which may reduce contamination of the microlenses 27 due to fine particles present in a manufacturing environment of the image sensor module 70.

FIGS. 2 through 9 are cross-sectional views of a manufacturing process for the image sensor device 40 of FIG. 1.

Referring to FIG. 2, a wafer 20 may be formed having a silicon substrate 21 and a plurality of image sensor chips 22 mounted on the silicon substrate 21. Scribe lines 24 may be formed between adjacent image sensor chips 22. Each of the plurality of image sensor chips 22 may have a plurality of chip pads 25 formed in a peripheral region of an active surface 23 and a color filter 28 formed at a central region of the active surface 23. Each of the plurality of image sensor chips 22 may further include an area 26 of the active surface (hereinafter referred to as one of an adhesive region, an attachment region, a bonding region and/or an intermediate region) between the peripheral region and the central region. A planarization layer 29 may be formed on the active surface 23 to cover the chip pads 25 and the color filter 28. Microlenses 27 may be arranged on the planarization layer 29 and indirectly on the color filter 28.

Referring to FIG. 3, a photosensitive pattern 38 may be formed to cover the microlenses 27. The photosensitive pattern 38 may include an opening 39 through which a portion of the planarization layer 29 on the chip pads 25 may be exposed. Referring to FIG. 4, the exposed portion of the planarization layer 29 may be removed to expose the chip pads 25. Referring to FIG. 5, the photosensitive pattern 38 may be removed with a removal process.

Referring to FIG. 6, a liquid photosensitive adhesive may be applied to the active surface 23 and may be rotated to form a photosensitive adhesive layer 35, for example having a uniform thickness. Referring to FIG. 7, the photosensitive adhesive layer 35 may be exposed and developed to form a photosensitive adhesive pattern 36. The photosensitive adhesive layer 35 may be removed using a conventional photolithography process. The conventional photolithography process may leave a portion of the photosensitive adhesive layer 35 (e.g., an adhesive residue) in the adhesive region 26. The photosensitive adhesive pattern 36 may thereby be formed as a square dam surrounding the microlenses 27. The height of the photosensitive adhesive pattern 36 may be greater than or equal to that of the microlenses 27.

Referring to FIG. 8, a protective plate 30 may be attached to the photosensitive adhesive pattern 36. The protective plate 30 may be aligned with the wafer 20, such that the chip pads 25 of the image sensor chip 22 may correspond to the through holes 37 of the protective plate 30.

Referring to FIG. 9, the wafer 20 having the protective plate 30 may be sawn along the scribe lines 24 with a sawing device 60. The wafer 20 may be separated by the sawing into a plurality of image sensor chips 22 each having a corresponding protective plate 32.

Referring again to FIG. 7, during the formation of the photosensitive adhesive layer 35, a residue 35a of the photosensitive adhesive layer 35 may remain on the active surface 23 and/or on the microlenses 27 after the above-described photolithography removal process. Since the microlenses 27 may each have a hemispheric shape and a curved surface, it may be difficult to spread a developing layer or solution to corners of the microlenses 27. Thus, the photosensitive adhesive layer 35 may not be completely removed.

The residue 35a may be cured during attachment of the protective plate 30 as illustrated in FIG. 8 and may thereafter remain on the microlenses 27, for example as a thin film or particles. The residue 35a may contaminate, damage and/or otherwise impair a functionality of the microlenses 27.

The image sensor module 70 of FIG. 1, including the microlenses 27 with the residue 35a as illustrated in FIGS. 7 and 8 may not function properly due at least in part to the residue 35a. For example, a contaminated portion (e.g., the residue 35a) of at least one of the microlenses 27 may scatter incident light which may be received at the microlenses 27 after the photolithography removal process. A likelihood that light energy from the received incident light may be transferred to a photodiode below the microlenses 27 may thereby be reduced, which may degrade the performance of the image sensor device 40 of the image sensor module 70.

SUMMARY OF THE INVENTION

An example embodiment of the present invention is directed to a method of reducing contamination in a microlens, including forming at least one chip on an active surface of a wafer, the at least one chip including at least one chip pad in a first region, forming a planarization layer on the at least one chip pad, forming at least one microlens on the planarization layer in a second region of the at least one chip, covering the at least one microlens with a first pattern, removing at least a portion of the planarization layer to expose the at least one chip pad, forming a second pattern on the first pattern, removing at least a portion of the second pattern to expose the first pattern and removing at least a portion of the first pattern to expose the at least one microlens.

Another example embodiment of the present invention is directed to a method of reducing contamination in a microlens, including forming a protective layer over at least one microlens, forming an adhesive layer over the protective layer, removing the adhesive layer to expose the protective layer and removing the protective layer to expose the at least one microlens, the exposed at least one microlens not including residue from the adhesive layer.

Another example embodiment of the present invention is directed to an image sensor device, including an image sensor chip mounted on a substrate, at least one microlens mounted on the image sensor chip and an adhesive layer attaching the image sensor chip to a protective plate, the at least one microlens not including residue from a removed portion of the adhesive layer.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
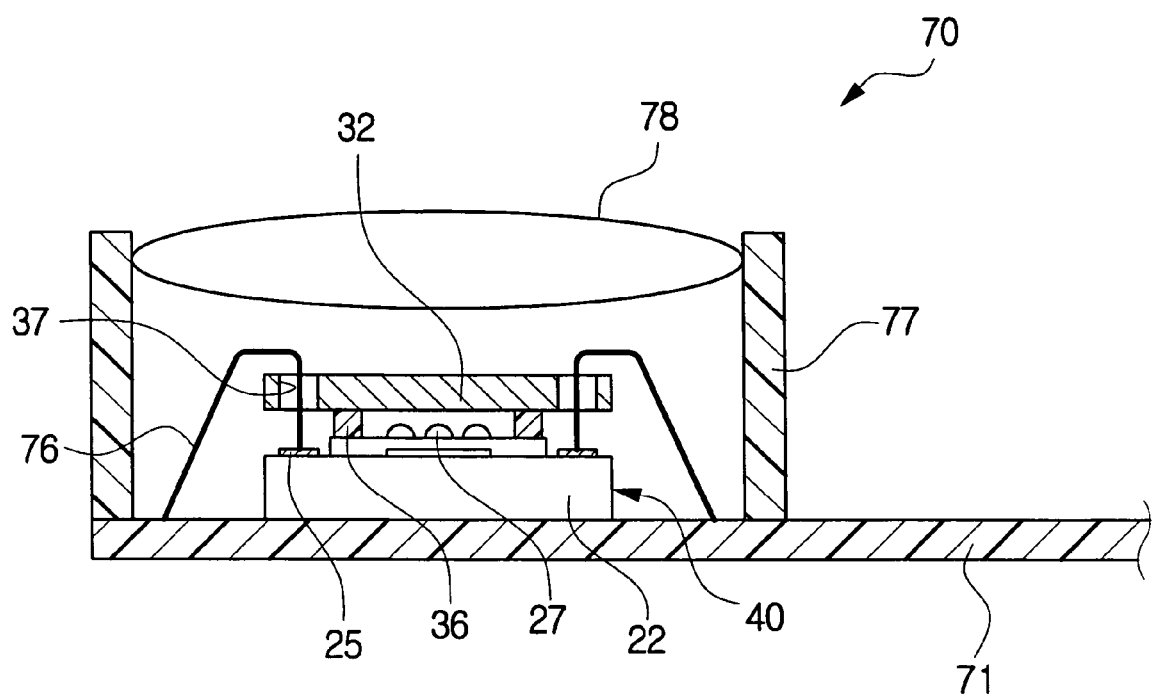
FIG. 1 is a cross-sectional view of a conventional image sensor module.
Figure 2:
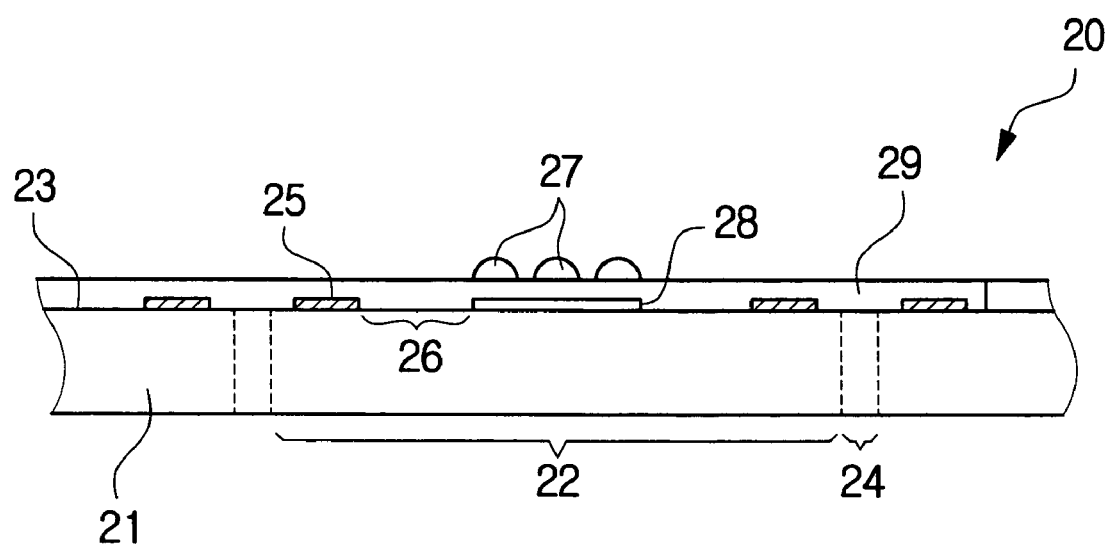
FIGS. 2 through 9 are cross-sectional views of a manufacturing process for the conventional image sensor device of FIG. 1.
Figure 3:
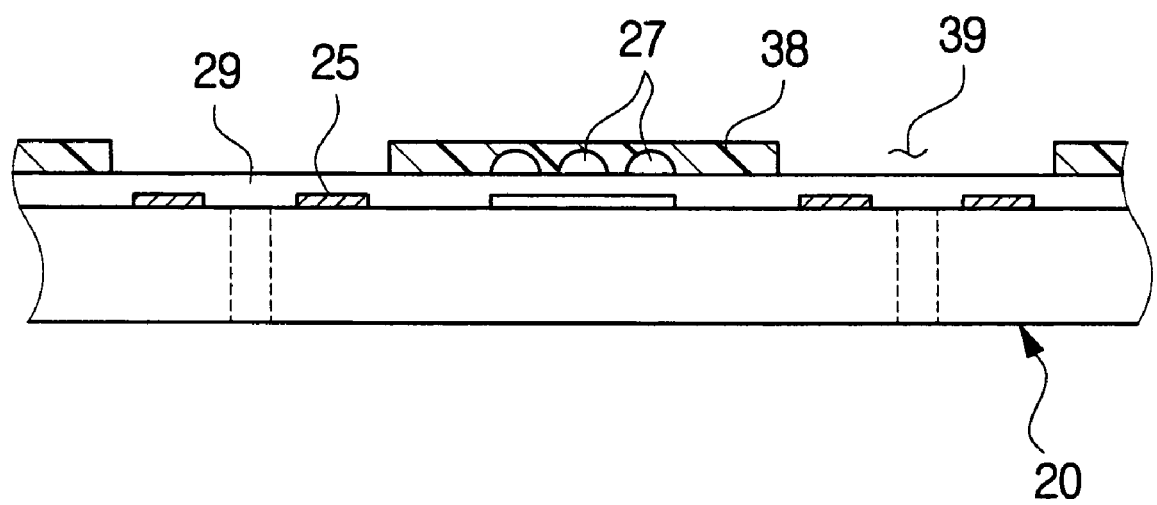
Figure 4:
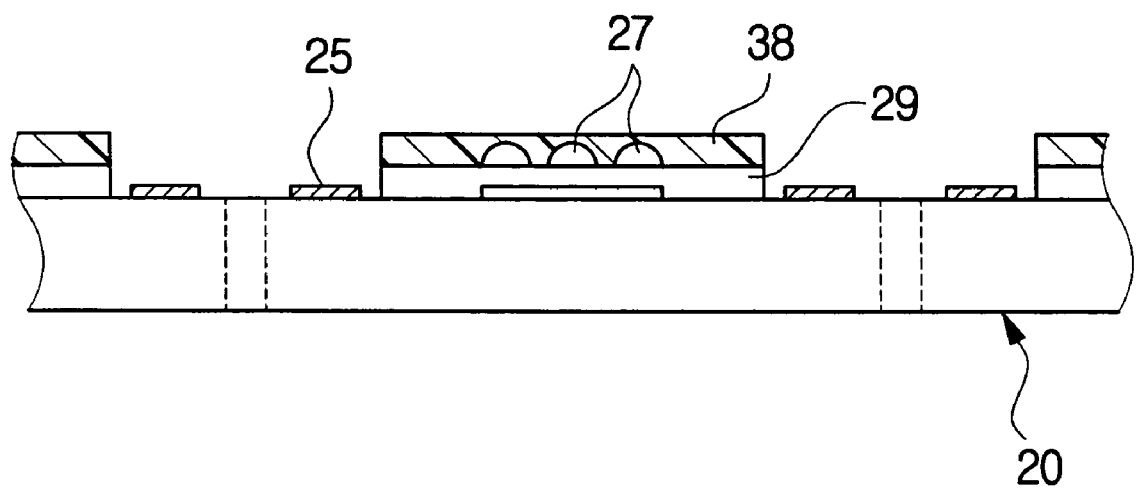
Figure 5:
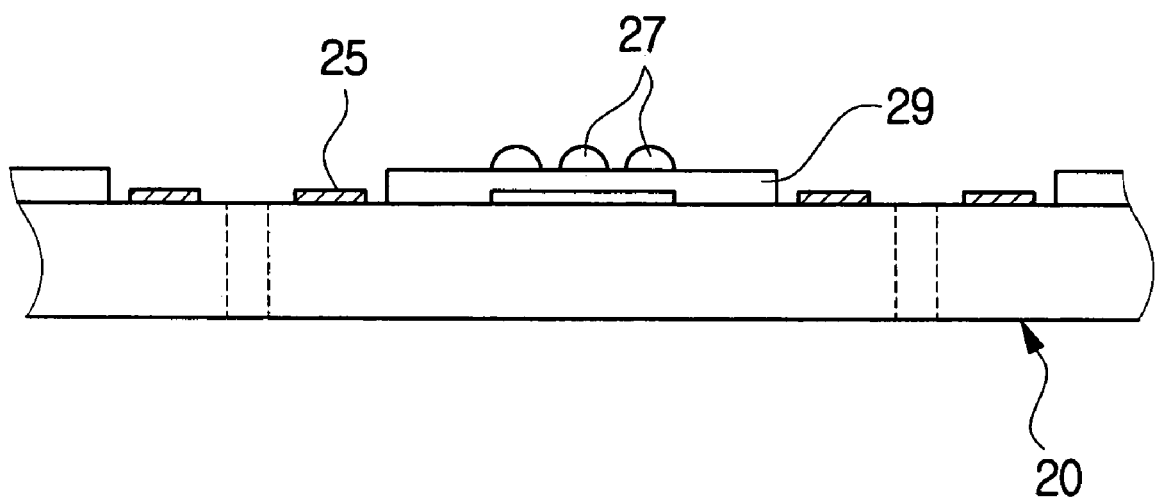
Figure 6:
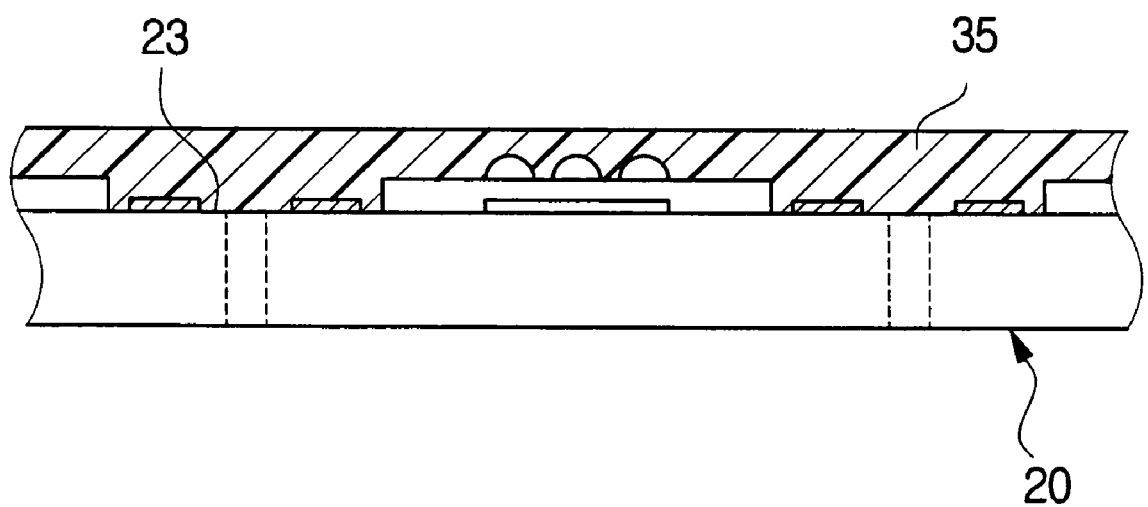
Figure 7:
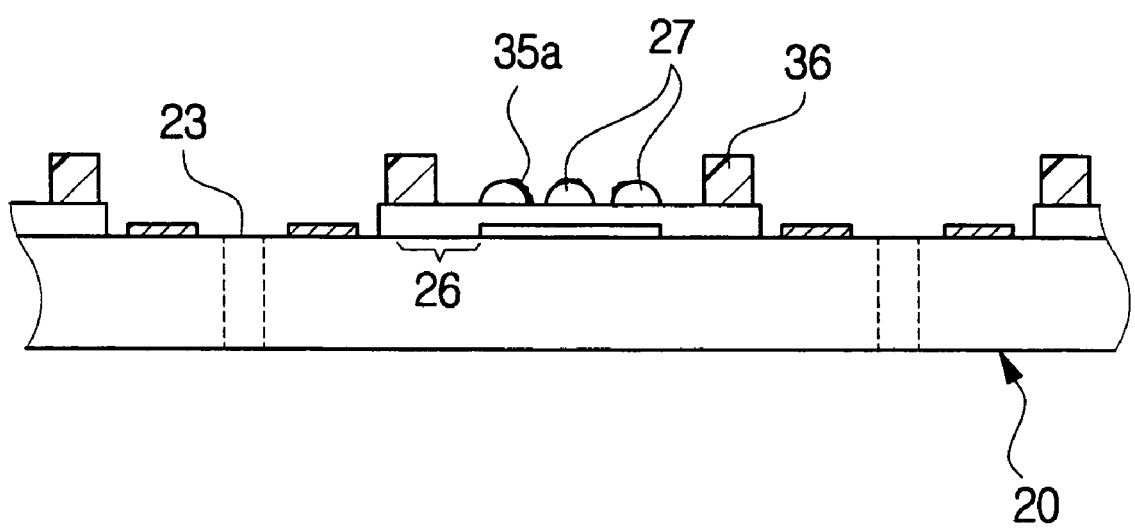
Figure 8:
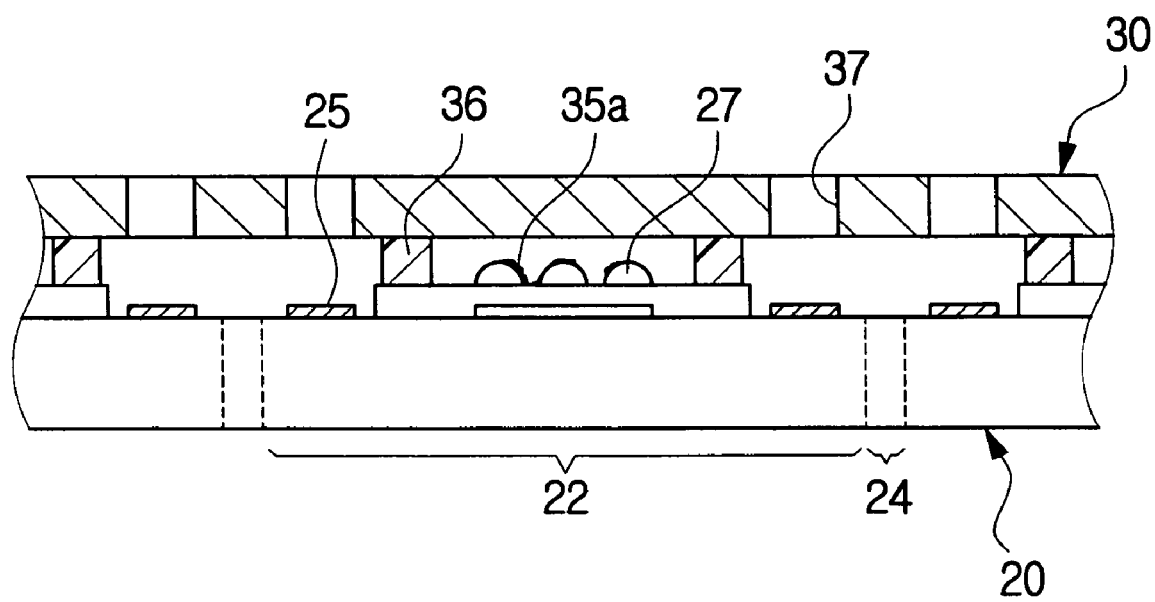
Figure 9:
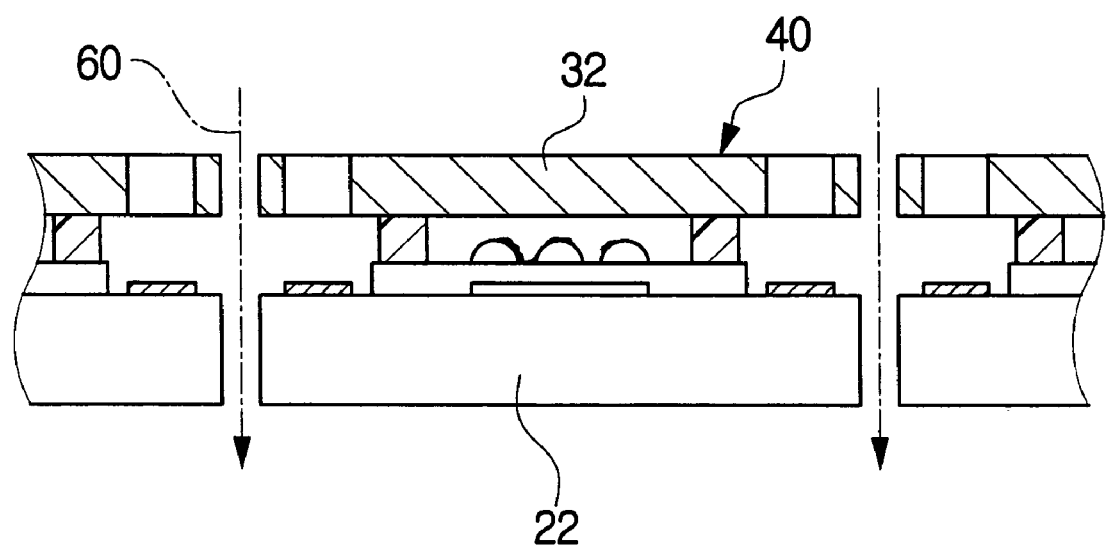

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but conversely, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected", "mounted on", "on" or "coupled" to another element, it can be directly connected/mounted on/on/coupled to the other element or intervening elements may be present. Conversely, when an element is referred to as being "directly connected", "directly mounted on", "directly on", "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described in detail with reference to the accompanying drawings.

In the Figures, the same reference numerals are used to denote the same elements throughout the drawings.

Figure 14:
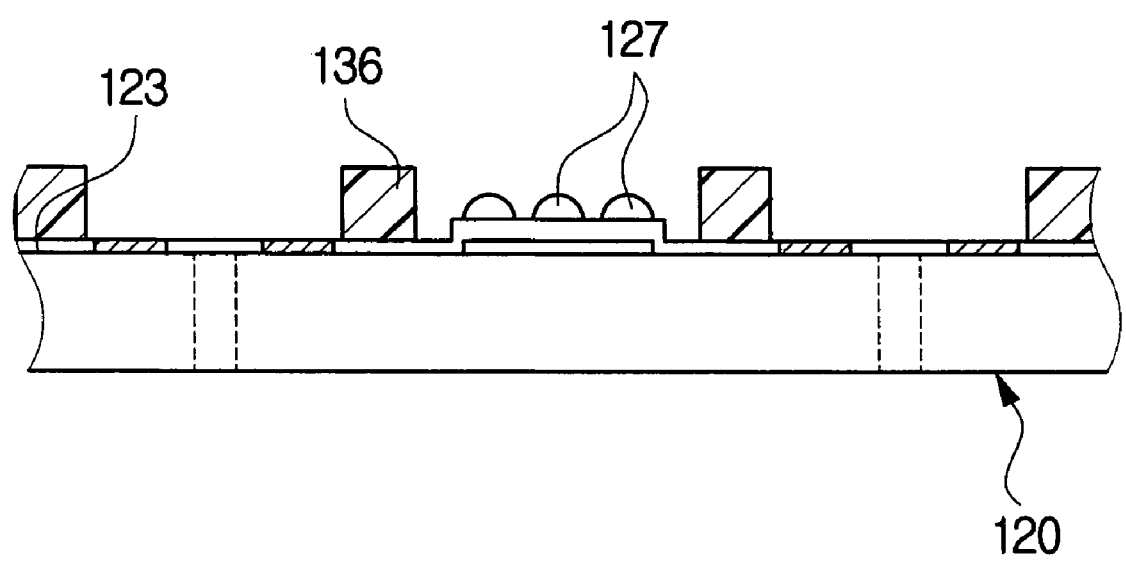
Figure 15:
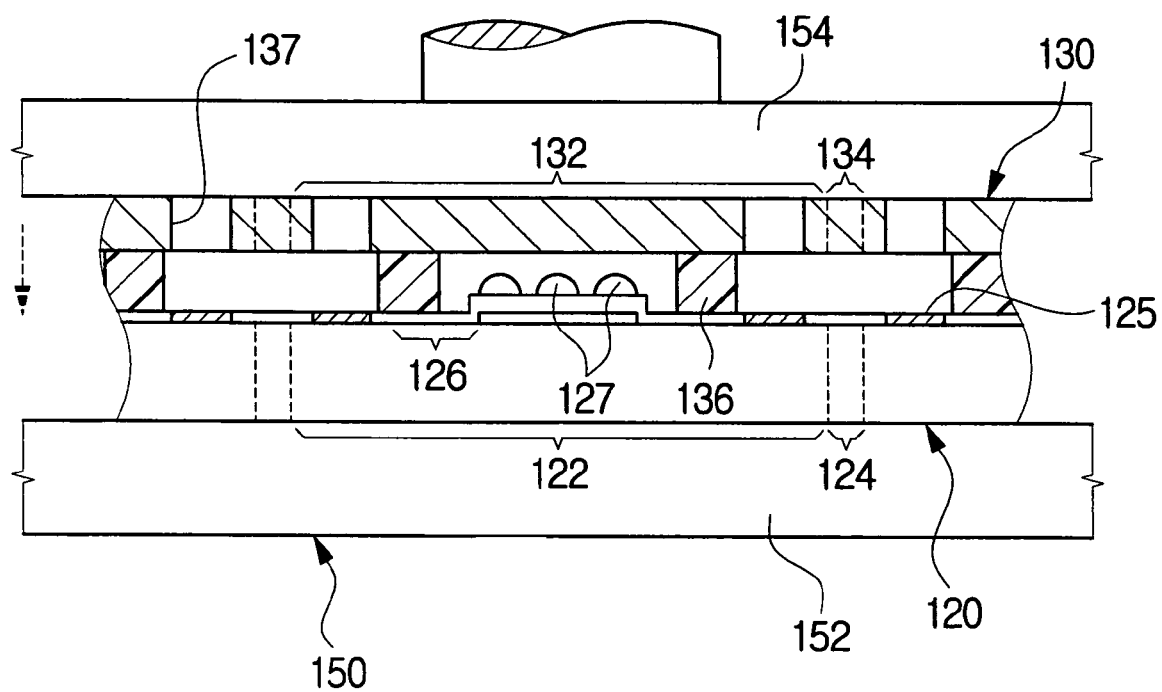
Figure 16:
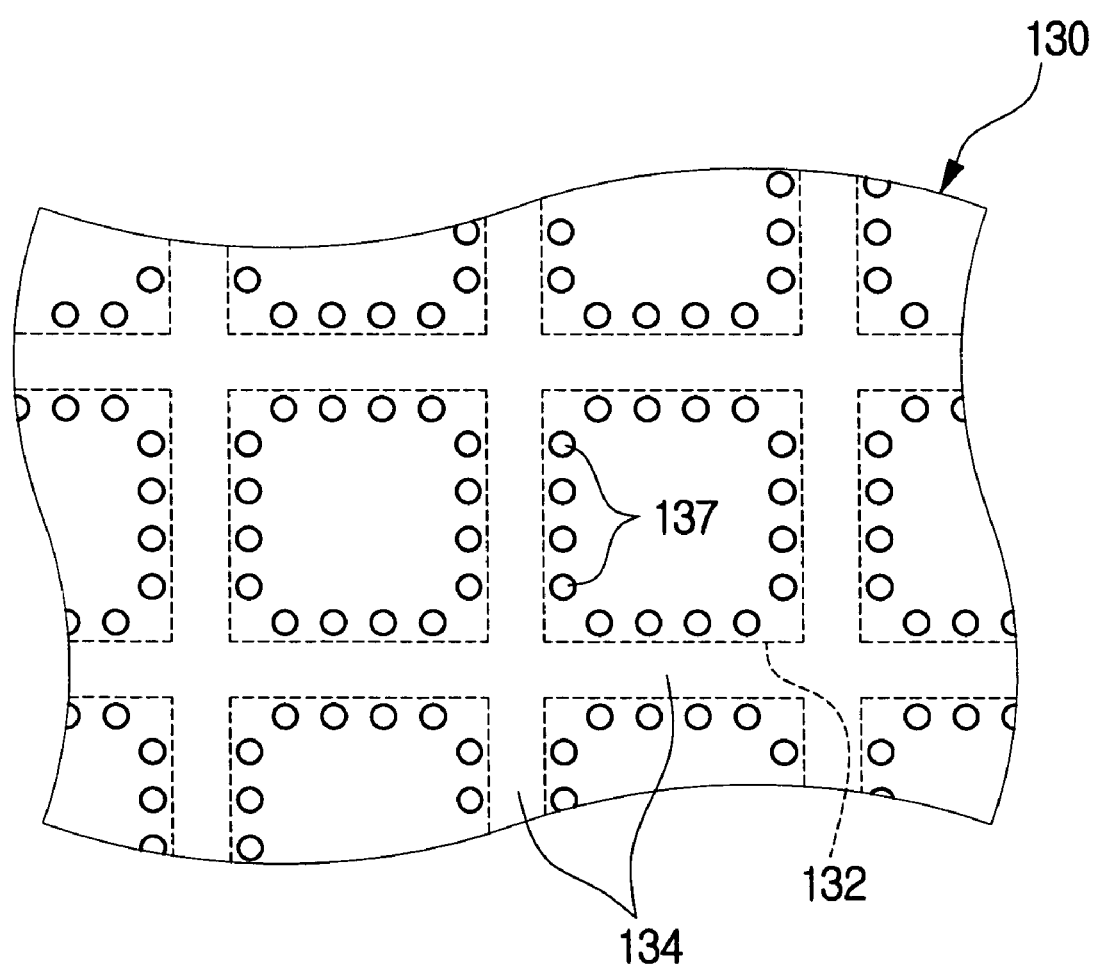

FIGS. 10-15 and 17 are cross-sectional views and FIG. 16 is a plan view illustrating a manufacturing process of an image sensor device 140 having a protective plate 130 in accordance with an example embodiment of the present invention.

Figure 10:
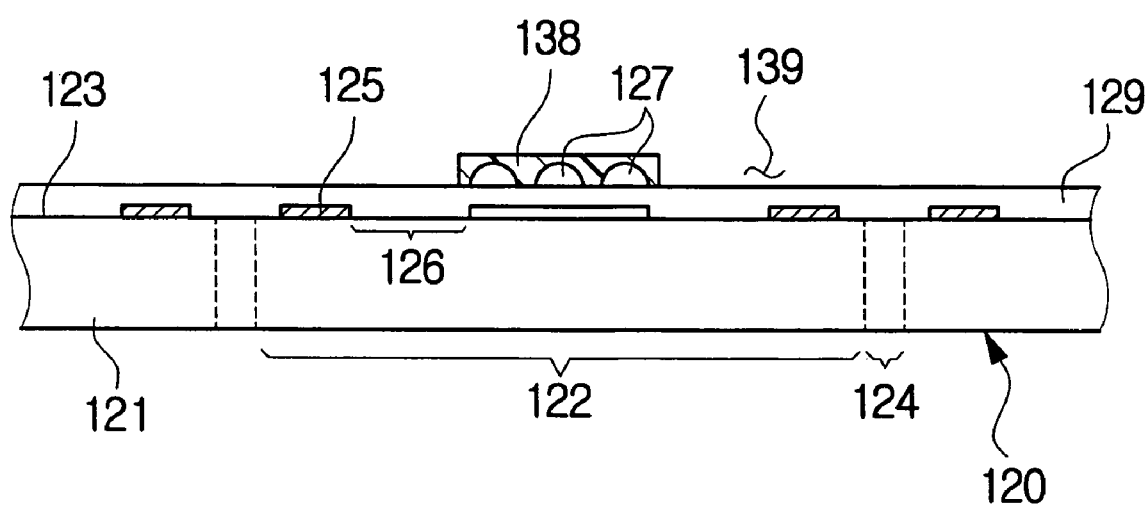
FIGS. 10-15 and 17 are cross-sectional views and FIG. 16 is a plan view illustrating a manufacturing process of an image sensor device having a protective plate in accordance with an example embodiment of the present invention.

In the example embodiment of FIG. 10, a wafer 120 may be formed having an active surface 123 and a back surface opposite the active surface 123. The wafer 120 may have a plurality of image sensor chips 122 which may be separated by a plurality of first scribe lines 124 formed between adjacent image sensor chips 122. Each of the plurality of image sensor chips 122 may include chip pads 125 formed in a peripheral region and a color filter 128 formed in a central region. A planarization layer 129 may be formed on the active surface 123 to cover the chip pads 125 and the color filter 128. Microlenses 127 may be formed on the planarization layer 129 and thereby indirectly on the color filter 128.

In the example embodiment of FIG. 10, each of the plurality of image sensor chips 122 may further include an adhesive region 126 in the active surface 123 between the peripheral region and the central area. The planarization layer 129 may protect the color filter 128 and may adjust a focal distance (e.g., of incident light). In an example, the microlenses 127 may be formed from polyimide resin and/or polyacryl resin, which may have a relatively low solidity. The construction of the plurality of image sensor chips 122 is well-known in the art and will not be described further for the sake of brevity.

In the example embodiment of FIG. 10, a photosensitive pattern 138 may be arranged or configured to cover at least a portion (e.g., an entirety) of the microlenses 127. The photosensitive pattern 138 may have an opening 139 through which at least a portion of the planarization layer 129 may be exposed. In an example, the photosensitive pattern 138 may include a novolak resin and/or other photosensitive materials.

While the example embodiment of FIG. 10 illustrates the planarization layer 129 as being exposed through the opening 139 of the photosensitive pattern 138, the scribe lines 124 may alternatively be covered with the photosensitive pattern 138 in other example embodiments of the present invention.

Figure 11:
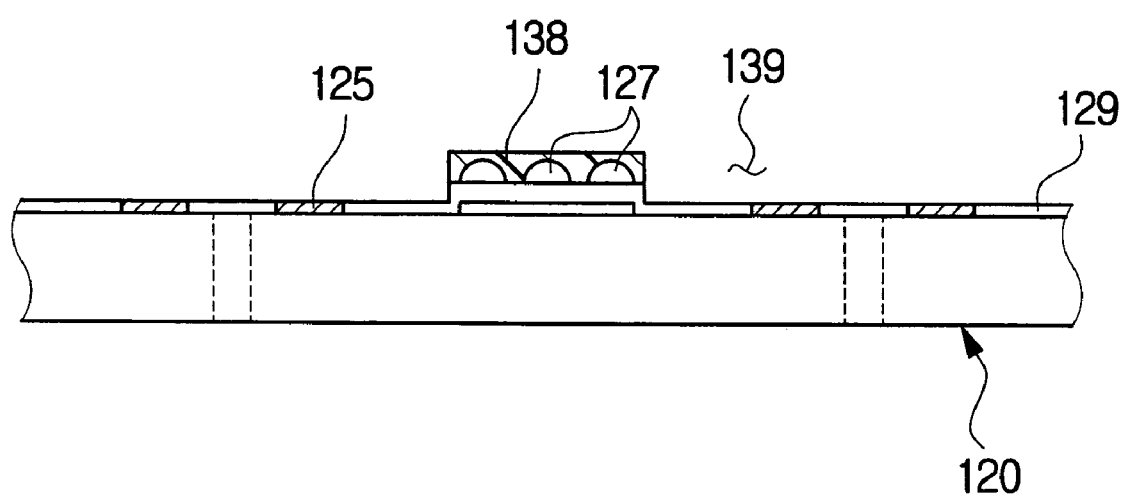

In the example embodiment of FIG. 11, a portion of the planarization layer 129 outside the photosensitive pattern 138 may be removed using the photosensitive pattern 138 as a mask, thereby exposing the upper surface of the chip pads 125. While the example embodiment of FIG. 11 illustrates only the upper surface of the chip pads 125 being exposed, the upper surface and/or the side surface of the chip pads 125 may be exposed in other example embodiments of the present invention. In an example, the photosensitive pattern 138 may be formed from a photosensitive solution to expose the chip pads 125. In another example, the photosensitive pattern 138 may be formed from a photosensitive solution removable from the microlenses 127. In a further example, the photosensitive solution may be inactive or resistant to an etching solution for removing a photosensitive adhesive.

Figure 12:
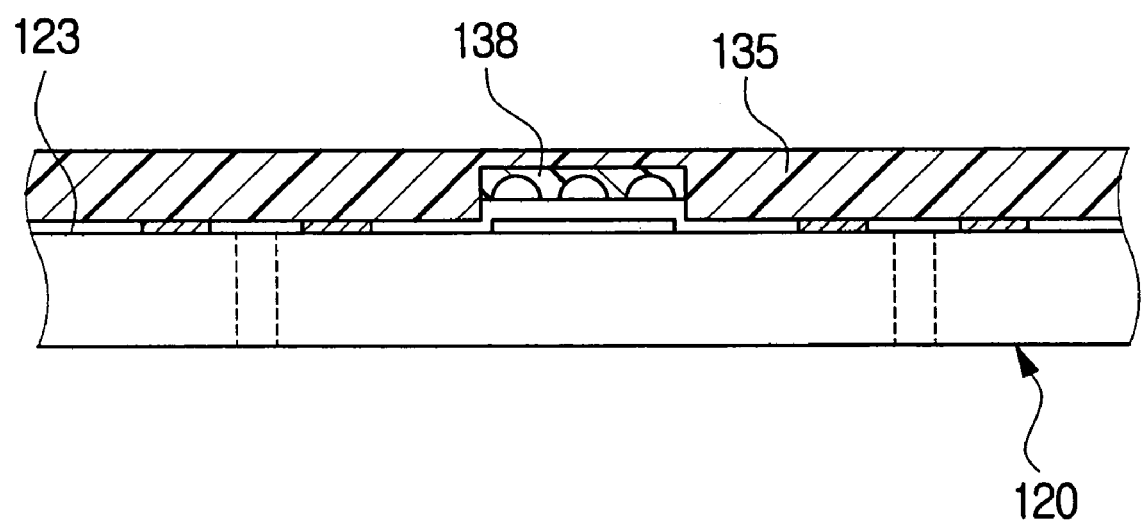

In the example embodiment of FIG. 12, a photosensitive adhesive layer 135 may be formed to cover the active surface 123 at a given thickness. In an example, the given thickness of the photosensitive adhesive layer 135 may be greater than or equal to the photosensitive pattern 138.

In the example embodiment of FIG. 12, the photosensitive adhesive layer 135 may be formed using any well-known method, such as a spray method, a spin-on dispensing method and/or a vaporization method. In an example, the spray method may be used to spray a layer of the photosensitive adhesive on the active surface 123. In an alternative example, the spin-on dispensing method may apply a given amount of the photosensitive adhesive to the center of the active surface 123 and the wafer 120 may be spun to distribute the photosensitive adhesive across the active surface 123. In yet another alternative example, the vaporization method may be used to vaporize a photosensitive adhesive on the active surface 123. For example, the photosensitive adhesive may be formed from a photosensitive polymer which may be patterned using a well-known photolithography process.

Figure 13:
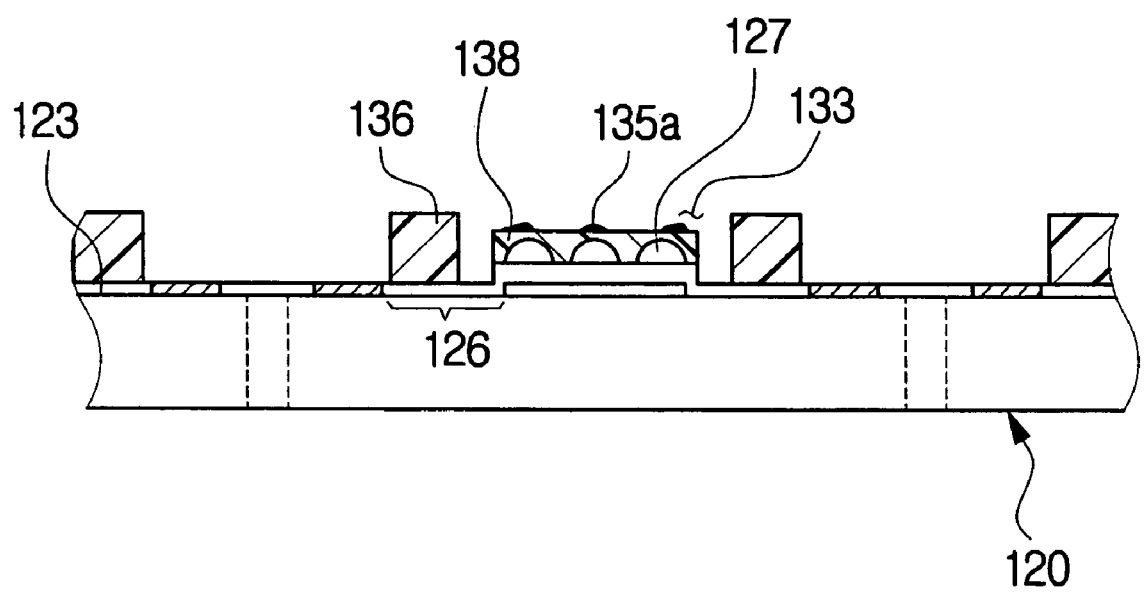

In the example embodiment of FIG. 13, the photosensitive adhesive layer 135 may be exposed and developed to form a photosensitive adhesive pattern 136. A first portion of the photosensitive adhesive layer 135 may be removed with a removal process (e.g., a photolithography process) and a second portion of the photosensitive adhesive layer 135 (e.g., corresponding to the adhesive region 126) may remain. The resultant photosensitive adhesive pattern 136 may form a square dam at least partially surrounding the microlenses 127. The photosensitive adhesive pattern 136 may have a cavity 133 having the photosensitive pattern 138.

In the example embodiment of FIG. 13, a residue 135a of the photosensitive adhesive 135 may remain on the photosensitive pattern 138 after the removal process. The photosensitive pattern 138 covering the microlenses 127 may protect the microlenses 127 from an external environment.

In the example embodiment of FIG. 14, the photosensitive pattern 138 may be removed. For example, an $O_2$ ashing process may remove the residue 135a on the photosensitive pattern 138 and may activate the surface of the photosensitive pattern 138. A wet etching process may use an etching solution to remove the photosensitive pattern 138. The photosensitive adhesive pattern 136 may be resistant to the etching solution and may thereby not be removed by the wet etching process. In an example, the etching solution may include an acetone and/or an isopropyl alcohol.

In the example embodiment of FIG. 14, impurities (e.g., the residue 135a) on the photosensitive pattern 138 may be removed, thereby reducing contamination or defects to the microlenses 127.

In the example embodiments of FIGS. 15 and 16, a protective plate 130 may be attached to the wafer 120. The protective plate 130 may be attached to the active surface 123 of the wafer 120 using, for example, a thermocompression process. In the thermocompression process, a combination of heat and pressure may be applied to the protective plate 130 mounted on the active surface 123 of the wafer 120 to attach the photosensitive adhesive pattern 136 to the corresponding adhesive region 126 provided on the image sensor chip 122.

In the example embodiment of FIGS. 15 and 16, the wafer 120 on which the protective plate 130 may been aligned and positioned, may be loaded in a thermocompressor 150. The wafer 120 having the protective plate 130 may be placed on the upper surface of a heater block 152 of the thermocompressor 150. The heater block 152 may increase in temperature until reaching a temperature sufficient for the thermocompression process. A compressor 154 of the thermocompressor 150 may move downward onto the exposed upper surface of the protective plate 130. The compressor 154 may be used to force the protective plate 130 and its photosensitive adhesive pattern 136 towards the active surface 123 of the wafer 120 and may apply a suitable force for a time period sufficient to attach the protective plate 130 to the wafer 120. The photosensitive adhesive pattern 136 may be partially or completely cured during the thermocompression process and may thereafter provide adhesion between the protective plate 130 and the wafer 120. The compressor 154 may be retracted to reduce the pressure on the protective plate 130 so as to allow the wafer 120 and the attached protective plate 130 to be unloaded from the thermocompressor 150.

In the example embodiment of FIG. 15, after the thermocompression process, the photosensitive adhesive pattern 136 may maintain a separation between the lower surface of the protective plate 130 facing the active surface 123 of the wafer 120 and the microlenses 127 of the image sensor chip 122. Since a portion of the upper surface of the photosensitive adhesive pattern 136 may be removed and activated (e.g., during the $O_2$ ashing process), a higher adhesion may be attained between the photosensitive adhesive pattern 136 and the protective plate 130.

In the example embodiment of FIGS. 15 and 16, the protective plate 130 may have a given thickness and a given size. In an example, the given size may be equivalent to the wafer 120. The protective plate 130 may include through holes 137 corresponding to the chip pads 125 of the plurality of image sensor chips 122. The through holes 137 may be configured so as to allow wire bonding. In an example, the protective plate 130 may include transparent materials having a coefficient of thermal expansion similar to that of the wafer 120, such as glass or quartz. The protective plate 130 may include second scribe lines 134 corresponding to the first scribe lines 124 of the wafer 120 along which the protective plate 130 may be separated into a plurality of protective plates 132. The through holes 137 may be arranged in the peripheral area of the plurality of protective plates 132.

In an example, referring to FIGS. 15 and 16, the thickness of the wafer 120 may be 750 micro-meters (μm), the thickness of the protective plate 130 may be 500 μm and the height of the photosensitive adhesive pattern 136 may be 30 μm.

In another example embodiment of the present invention, referring to FIGS. 10-16, if the image sensor device 140 is a thin image sensor device, the example manufacturing process may further include removing a portion of the back surface of the wafer 120.

Figure 17:
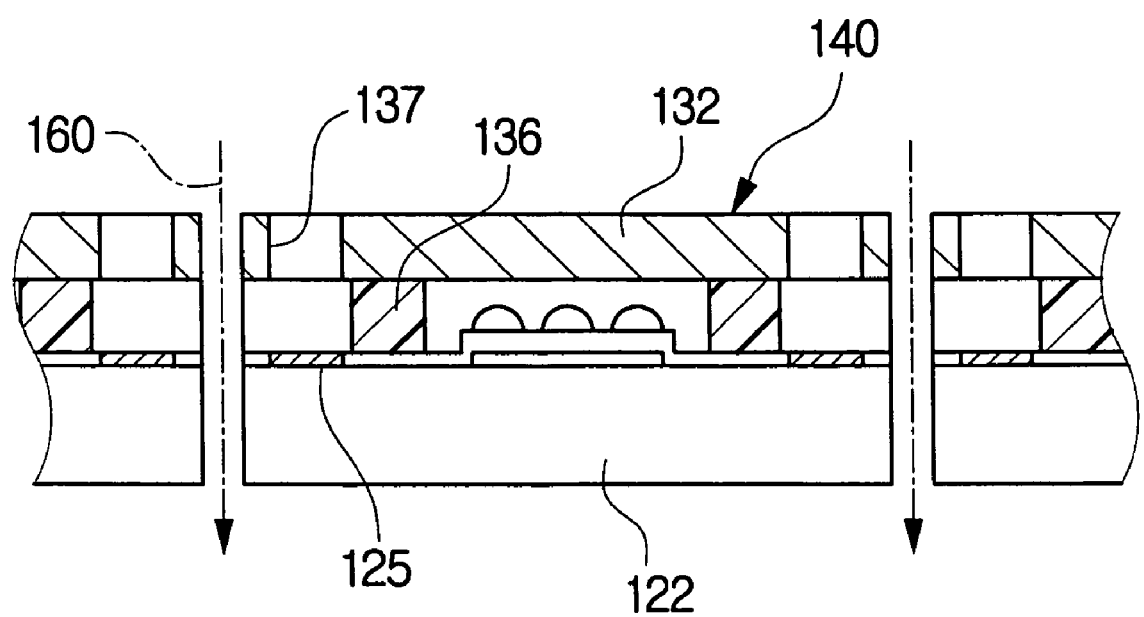

In the example embodiment of FIG. 17, the wafer 120 may be separated into a plurality of image sensor devices 140. For example, the wafer 120 may be sawn along the first scribe lines 124 using a sawing device 160 such that the plurality of image sensor chips 122, each including the protective plate 132, may be separated. In the example sawing process, a wafer backing tape may be attached to the back surface of the wafer 120. Alternatively, in another example, the wafer 120 may be fixed with a support means without the use of the wafer backing tape.

In the example embodiment of FIG. 17, the plurality of image sensor chips 122 having respective protective plates 132 may be obtained at a wafer level, thereby allowing a mass production or fabrication of the image sensor chips 122 having corresponding protective plates 132.

Figure 18:
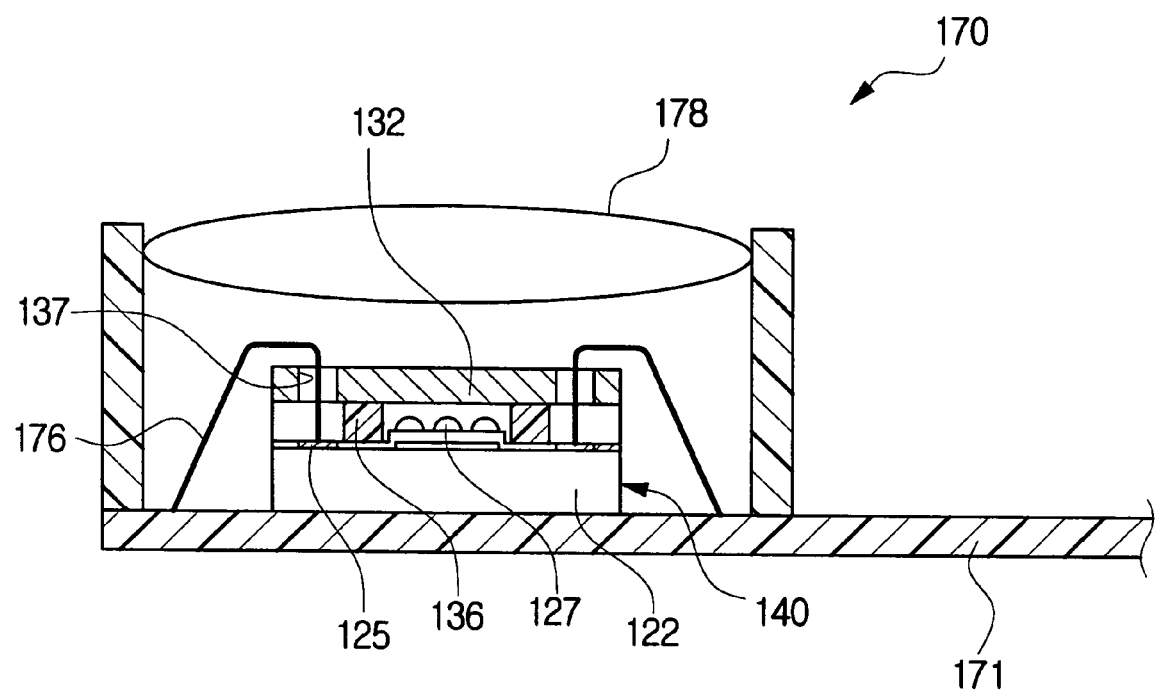
FIG. 18 illustrates a cross-sectional view of an image sensor module including an image sensor device according to another example embodiment of the present invention.

FIG. 18 illustrates a cross-sectional view of an image sensor module 170 including the image sensor device 140 according to another example embodiment of the present invention.

In the example embodiment of FIG. 18, since the chip pads 125 of the image sensor chip 122 may be exposed through the through holes 137 of the protective plate 130, the image sensor device 140 may be included within the image sensor module 170. The image sensor module 170 may include a flexible circuit substrate 171 and the image sensor device 140 may be mounted on an upper surface of the flexible circuit substrate 171. The image sensor device 140 may include an image sensor chip 122 having chip pads 125 and a microlens 127. The protective plate 132 may be attached to the image sensor device 140 with the photosensitive adhesive pattern 136. The protective plate 132 may include through holes 137 through which the chip pads 125 of the image sensor chip 122 may be exposed. Bonding wires 176 may electrically connect the flexible circuit substrate 171 to the chip pads 125 of the image sensor chip 122. A lens unit 177 may be formed on the upper surface of the flexible circuit substrate 171 surrounding or at least partially surrounding the image sensor device 140 and may include a lens 178 for focusing an image on the image sensor device 140 and/or protecting the image sensor device 140.

In another example embodiment of the invention, a photosensitive pattern may protect microlenses from adhesive residue, thereby reducing contamination of microlenses. The improved microlenses may increase a performance and/or productivity of an image sensor device including the improved microlenses.

Example embodiments of the present invention being thus described, it will be obvious that the same may be varied in many ways. For example, while the above-described example method of separating the wafer 120 is given as a sawing process, it is understood that any well-known separation process may be employed in other example embodiments of the present invention. For example, a laser may be used to separate the wafer 120 along the scribe lines in other example embodiments of the present invention.

Such variations are not to be regarded as departure from the spirit and scope of example embodiments of the present invention, and all such modifications as would be obvious to one skilled in the art are intended to be included within the scope of the following claims.

What is claimed is:

1. A method of reducing contamination in a microlens, comprising:
    forming at least one chip on an active surface of a wafer, the at least one chip including at least one chip pad in a first region;
    forming a planarization layer on the at least one chip pad;
    forming at least one microlens on the planarization layer in a second region of the at least one chip;
    covering the at least one microlens with a first pattern;
    removing at least a portion of the planarization layer to expose the at least one chip pad;
    forming a second pattern on the first pattern;
    removing at least a portion of the second pattern to expose the first pattern; and
    removing at least a portion of the first pattern to expose the at least one microlens.

2. The method of claim 1, wherein the first region is a peripheral region of the at least one chip and the second region is a central region of the at least one chip.

3. The method of claim 1, wherein the removed portion of the planarization layer includes the planarization layer in positions other than those covered by the first pattern.

4. The method of claim 1, wherein a residue of the second pattern is removed while removing the first pattern.

5. The method of claim 1, wherein the first pattern is a photosensitive pattern and the second pattern is a photosensitive adhesive pattern.

6. The method of claim 1, wherein the at least one chip includes an image sensor chip.

7. The method of claim 1, wherein covering the at least one microlens with the first pattern includes forming a photosensitive layer on the active surface and removing a portion of the photosensitive layer, the removed portion not covering the at least one microlens.

8. The method of claim 7, wherein the photosensitive layer includes a novolak resin.

9. The method of claim 1, wherein forming the second pattern includes applying a photosensitive adhesive on the active surface to form a photosensitive adhesive layer and patterning the photosensitive adhesive layer to form a photosensitive adhesive pattern.

10. The method of claim 9, wherein the photosensitive adhesive pattern is formed at a thickness being greater than or equal to the first pattern.

11. The method of claim 7, wherein removing the portion of the photosensitive layer includes $O_2$ ashing a residue of a photosensitive adhesive remaining on the photosensitive layer and wet etching the photosensitive layer with an etching solution.

12. The method of claim 11, wherein the etching solution includes at least one of an acetone and an isopropyl alcohol.

13. A method for manufacturing an image sensor device, comprising:
the method of claim 1; and
attaching a protective plate to the second pattern.

14. The method of claim 13, wherein the protective plate includes at least one through hole corresponding to the at least one chip pad.

15. The method of claim 13, wherein the protective plate includes at least one of glass and quartz.

16. The method of claim 13, further comprising:
separating the wafer along the scribe lines to form a plurality of image sensor devices with a plurality of protective plate portions, the plurality of protective plate portions each being a portion of the attached protective plate.

17. The method of claim 16, wherein separating the wafer includes sawing the wafer along the scribe lines.

18. A method of reducing contamination in a microlens, comprising:
forming a protective layer over at least one microlens;
forming an adhesive layer over the protective layer;
removing the adhesive layer to expose the protective layer; and
removing the protective layer to expose the at least one microlens, the exposed at least one microlens not including residue from the adhesive layer.

19. The method of claim 18, wherein removing the adhesive layer and removing the protective layer are performed with different processes.

20. The method of claim 19, wherein removing the adhesive layer is performed by a photolithography process and removing the protective layer is performed by at least one of $O_2$ ashing and wet etching.

* * * * *